(12) United States Patent
Lee et al.

(10) Patent No.: US 10,910,594 B2
(45) Date of Patent: Feb. 2, 2021

(54) ENCAPSULATION FILM

(71) Applicant: LG CHEM, LTD., Seoul (KR)

(72) Inventors: Jung Woo Lee, Daejeon (KR); Hyun Jee Yoo, Daejeon (KR); Hyun Suk Kim, Daejeon (KR); Jung Ok Moon, Daejeon (KR); Se Woo Yang, Daejeon (KR)

(73) Assignee: LG CHEM LTD., Seoul (KR)

( * ) Notice: Subject to any disclaimer, the term of this patent is extended or adjusted under 35 U.S.C. 154(b) by 0 days.

(21) Appl. No.: 16/090,014

(22) PCT Filed: Apr. 3, 2017

(86) PCT No.: PCT/KR2017/003637
§ 371 (c)(1),
(2) Date: Sep. 28, 2018

(87) PCT Pub. No.: WO2017/171518
PCT Pub. Date: Oct. 5, 2017

(65) Prior Publication Data
US 2019/0123299 A1    Apr. 25, 2019

(30) Foreign Application Priority Data
Apr. 1, 2016 (KR) .................. 10-2016-0040114

(51) Int. Cl.
| | | |
|---|---|---|
| H01L 51/52 | (2006.01) |
| C09K 3/10 | (2006.01) |
| C09J 7/28 | (2018.01) |
| H01L 51/00 | (2006.01) |

(52) U.S. Cl.
CPC ............ *H01L 51/5253* (2013.01); *C09J 7/28* (2018.01); *C09K 3/10* (2013.01); *H01L 51/0096* (2013.01); *C09J 2203/326* (2013.01); *C09J 2301/208* (2020.08); *C09J 2301/302* (2020.08); *H01L 2251/558* (2013.01)

(58) Field of Classification Search
None
See application file for complete search history.

(56) References Cited

U.S. PATENT DOCUMENTS 10,410,962 B2 *  9/2019  McMahon .......... H01L 21/0206
2002/0003403 A1   1/2002  Ghosh et al.
(Continued)

FOREIGN PATENT DOCUMENTS

CN    1448455 A    10/2003
CN    101945965 A   1/2011
(Continued)

*Primary Examiner* — Michelle Mandala
(74) *Attorney, Agent, or Firm* — Dentons US LLP

(57) ABSTRACT

The present application relates to an encapsulation film, a method for manufacturing the same, a method for manufacturing an organic electronic device using the same, and an organic electronic device comprising the same, and provides an encapsulation film which allows forming a structure capable of effectively blocking moisture or oxygen introduced into the organic electronic device from the outside, and has excellent handleability and processability, and excellent bonding property between the encapsulation layer and the panel of the organic electronic device and endurance reliability.

18 Claims, 1 Drawing Sheet

(56) References Cited

U.S. PATENT DOCUMENTS

2011/0096388 A1\* 4/2011 Agrawal .................. G02F 1/155
 359/268
2014/0044957 A1\* 2/2014 Hirayama ............. H01L 23/293
 428/327
2018/0358574 A1\* 12/2018 Musa .................. H01L 51/0031

FOREIGN PATENT DOCUMENTS

| CN | 103199199 A | 7/2013 |
|----|----|----|
| CN | 103998239 A | 8/2014 |
| CN | 105247699 A | 1/2016 |
| EP | 3001478 A1 | 3/2016 |
| JP | 2001-324720 A | 11/2001 |
| JP | 2006-156150 A | 6/2006 |
| JP | 2011-32318 A | 2/2011 |
| JP | 5517776 B2 | 6/2014 |
| JP | 2015-509864 A | 4/2015 |
| KR | 10-0157513 B1 | 12/1998 |
| KR | 10-1251641 B1 | 4/2013 |
| KR | 10-2013-0081261 A | 7/2013 |
| KR | 10-2013-0090386 A | 8/2013 |
| KR | 10-1428868 B1 | 8/2014 |
| KR | 10-2014-0136901 A | 12/2014 |
| KR | 10-1589754 B1 | 1/2016 |

\* cited by examiner

[Figure 1]
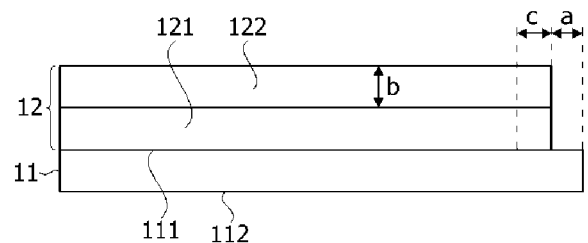
[Figure 2]
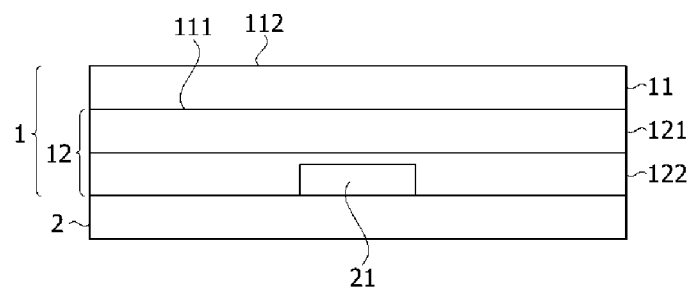

ENCAPSULATION FILM

This application is a National Stage Application of International Application No. PCT/KR2017/003637 filed Apr. 3, 2017, and claims the benefit of Korean Patent Application No. 10-2016-0040114 filed Apr. 1, 2016, all of which are hereby incorporated by reference in their entirety for all purposes as if fully set forth herein.

TECHNICAL FIELD

The present invention relates to an encapsulation film, a method for manufacturing the encapsulation film, an organic electronic device comprising the same, and a method for manufacturing an organic electronic device using the same.

BACKGROUND ART

An organic electronic device (OED) means a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields covering various portable devices, monitors, notebooks, and TVs.

In commercialization and application expansion of the OLED, the most important problem is a durability problem. Organic materials and metal electrodes, and the like contained in the OLED are very easily oxidized by external factors such as moisture. Thus, products containing OLEDs are highly sensitive to environmental factors. In order to solve the above problems, encapsulation materials for encapsulating organic electronic devices have been applied, where automated distribution processes of thin encapsulation materials are difficult and occurrence of defects such as alignment errors in processes of attaching an encapsulation layer of an encapsulation film and a substrate such as a metal layer is high due to gradually decreasing bezels. Therefore, technical trends are proceeding in such a method that panels are applied by pre-attaching the encapsulation layer and the substrate in a roll-to-roll manner and then cutting them. Such as process can solve problems that may occur in the process of attaching the encapsulating layer and the substrate, but since the sizes of the encapsulation layer and the substrate are almost the same, there is a contamination problem of organic electronic devices and panels due to overflow of the encapsulation layer in bonding and thermosetting processes. A method for solving the above problems is required.

DISCLOSURE

Technical Problem

The present application provides an encapsulation film which allows forming a structure capable of effectively blocking moisture or oxygen introduced into the organic electronic device from the outside, and has excellent handleability and processability, and excellent bonding property between the encapsulation layer and the panel of the organic electronic device and endurance reliability.

Technical Solution

The present application relates to an encapsulation film. The encapsulation film can be applied to sealing or encapsulating organic electronic devices such as, for example, OLEDs. In this specification, the encapsulation film may be expressed as an encapsulation material or an encapsulation sheet.

In this specification, the term "organic electronic device" means an article or device having a structure comprising an organic material layer that generates alternate current of charges using holes and electrons between a pair of electrodes facing each other, and an example thereof may include, but is not limited to, a photovoltaic device, a rectifier, a transmitter and an organic light emitting diode (OLED), and the like. In one example of the present invention, the organic electronic device may be an OLED.

As shown in FIG. 1, an exemplary encapsulation film comprises a metal layer (11) having a first surface (111) and a second surface (112) opposite to the first surface (111), and an encapsulation layer (12) provided on the first surface (111) of the metal layer (11). Here, the encapsulation layer (12) may be provided on the first surface (111) so as to be located inside the edge of the first surface (111), so that the edge of some area forms a gap of 50 μm to 500 μm with the edge of the first surface (111). The gap may be present on at least some of the edges of the encapsulation layer (12), but it is not limited thereto and may be present on all edges. In addition, the encapsulation layer (12) may comprise a pressure-sensitive adhesive layer (121) and an adhesive layer (122). The adhesive layer (122) may have a thickness (b) of 5 μm to 40 μm. In an embodiment of the present application, the gap (a) may be 75 μm or more, 80 μm or more, or 95 μm or more, may be 175 μm or less, or 150 μm or less, the thickness of the adhesive layer may be 10 μm or more, 15 μm or more, 20μ or more, or 23 μm or more, and may be 35 μm or less, 30 μm or less, 28 μm or less, or 25 μm or less. As shown in FIG. 1, the term gap (a) may mean a distance between side ends of each of the laminated encapsulation layer (12) and metal layer (11). By controlling the gap (a) in the range of 50 to 500 μm and the thickness (b) of the adhesive layer in the range of 5 μm to 40 μm, the present application provides an encapsulation material excellent bonding properties and adhesion reliability to an organic electronic device panel without any overflow of the encapsulation layer in spite of flow of the encapsulation layer in bonding and curing processes at high temperature when the film is applied to encapsulate an organic electronic element entirely.

The gap and the thickness of the adhesive layer can be adjusted to the above range in consideration of the fluidity of the encapsulation layer in contact with the metal layer, in particular, in terms of the characteristics of the encapsulation film of the present application provided integrally with the metal layer. In addition, the gap and the thickness of the adhesive layer can be adjusted depending on composition of the encapsulating layer, physical properties and physical features of the encapsulating layer, or application objects of the encapsulation layer (for example, a substrate on which an organic electronic element is formed), but is not limited thereto.

In one example, the metal layer and/or the encapsulating layer may be polygonal or circular. In the encapsulation film of the present application, the side end positions of the metal layer and the encapsulation layer may be the same at some edges, but is not limited thereto, and as described above, a predetermined gap (a) may be formed at the edge of at least some area in the encapsulation film. In another example, the gap (a) may be present at all edges of the encapsulation film. The term "same" herein means substantially the same, and may have an error range of ±5 μm or ±1 μm.

In addition, as shown in FIG. 1, the encapsulation layer (12) comprises a pressure-sensitive adhesive layer (121) and an adhesive layer (122), and in one example, the pressure-sensitive adhesive layer (121) and the adhesive layer (122) may be present in a state where the layers are successively laminated to each other. At this time, the pressure-sensitive adhesive layer (121) may be attached to the metal layer (11), and the adhesive layer (122) may seal the entire surface of the organic electronic element. Here, the pressure-sensitive adhesive layer (121) may be attached to the metal layer (11) by other mediating layers, without being limited thereto, and the pressure-sensitive adhesive layer (121) may be directly attached to and contact the metal layer (11). The mediating layer may be a pressure-sensitive adhesive layer or an adhesive layer.

The term "pressure-sensitive adhesive" herein may mean a component which can retain viscosity at room temperature, be adhered by applying pressure, exhibit a strong holding force after adhesion, hold cohesiveness and elasticity, be re-peeled, and be also again adhered after peeling by applying pressure. The term "adhesive" herein is a component that can provide a permanent bond, rather than a temporary bond, unlike the pressure-sensitive adhesive component, and may mean a component which can be typically applied in a liquid phase for bonding, and solidified, cooled or cured to exhibit adhesive strength, and cause physical destruction phenomena upon separating the bonded object after bonding. That is, the adhesive may mean a component that re-peeling is impossible and cannot be adhered again upon separating the adhesive from the adherend by physical breakdown.

In an embodiment of the present application, the encapsulation layer (12) may have a cured portion at the edge of some area. In the present application, when the film is applied to encapsulate an organic electronic element, the encapsulation layer may have a cured portion on the side of at least some area to control flow of the encapsulation layer by heat. Here, the cured portion may be a width (c) in a range of 10 μm to 100 μm, 17 μm to 92 μm, 21 μm to 88 μm, or 28 μm to 77 μm. In addition, the cured portion may have a degree of curing ranging from 10% to 100%, from 20% to 85%, from 25% to 65%, or from 33% to 48%. The degree of curing may be, in the encapsulation layer, the degree of curing of the adhesive layer or the degree of curing of the pressure-sensitive adhesive layer. The range of the width or the degree of curing may be the range for minimizing the flow width of the encapsulation layer upon bonding in relation to the gap described above. The measurement of the degree of curing can be performed by a method known in the art. In one example, the degree of curing can be measured using ATR FT-IR. The degree of curing using the ATR FT-IR may be measured as a percentage of the amount of change (P1-P2) of the curable functional group peak (P2) of the sample for measuring the degree of curing, to the curable functional group peak (P1) of the uncured sample. That is, the degree of curing can be calculated as (P1−P2)/P1×100. In the above, the curable functional group may be, for example, an epoxy group. Furthermore, in one example, the degree of curing may be defined as a percentage ((1−H2/H1)×100) of curing heat (H2) generated during post-curing the sample for measuring the degree of curing, to curing heat (H1) generated during post-curing the uncured sample. Also, the curing heat may be one which measures heat generated during heating the sample at a heating rate of about 10° C./min, using DSC (Differential Scanning calorimetry).

Furthermore, in one example, the side of the encapsulation layer in the encapsulation film of the present application may be a laser beam cutting surface having a size of 1 μm to 1000 μm. That is, the encapsulation layer is cut through the laser beam, and the laser beam may have a size in the range of 1 μm to 1000 μm. Here, the laser may be a $CO_2$ laser or an optical fiber laser, but is not limited thereto.

In an embodiment of the present application, the metal layer of the encapsulation film may be transparent and opaque. The metal layer may be a thin metal foil or a polymer base layer deposited with metal. As the metal layer, a material having thermal conductivity and moisture barrier properties can be used without limitation. The metal layer herein may mean a layer based on metal. For example, the metal layer may comprise any one of a metal, a metal oxide, a metal nitride, a metal carbide, a metal oxynitride, a metal oxyboride and a combination thereof. For example, the metal layer may comprise an alloy in which one or more metal elements or non-metal elements are added to one metal, and may comprise, for example, an iron-nickel alloy or stainless steel (SUS). In addition, in one example, the metal layer may comprise copper, aluminum, nickel, silicon oxide, aluminum oxide, titanium oxide, indium oxide, tin oxide, indium tin oxide, tantalum oxide, zirconium oxide, niobium oxide and a combination thereof. The metal layer may be deposited by means of electrolysis, rolling, thermal evaporation, electron beam evaporation, sputtering, reactive sputtering, chemical vapor deposition, plasma chemical vapor deposition or electron cyclotron resonance source plasma chemical vapor deposition. In one example of the present application, the metal layer may be deposited by reactive sputtering.

Preferably, the metal layer may have a thermal conductivity of 50 W/mK or more, 60 W/mK or more, 70 W/mK or more, 80 W/mK or more, 90 W/mK or more, 100 W/mK or more, 110 W/MK or more, 120 W/MK or more, 130 W/MK or more, 140 W/mK or more, 150 W/mK or more, 200 W/mK or more, or 250 W/mK or more. By having high thermal conductivity in the above range, the heat generated at the bonding interface during the metal layer bonding process can be released more quickly. Also, the high thermal conductivity rapidly releases the heat accumulated during the operation of the organic electronic device to the outside, whereby the temperature of the organic electronic device itself can be maintained lower, and the occurrence of cracks and defects is reduced.

The term "thermal conductivity" herein is a degree representing capability in which a material is capable of transferring heat by conduction, where the unit may be expressed by W/mK. The unit represents the degree to which the material transfers heat at the same temperature and distance, which means a unit of heat (watt) to a unit of distance (meter) and a unit of temperature (kellvin).

The encapsulating layer may comprise an encapsulation resin. In an embodiment of the present application, the pressure-sensitive adhesive layer in the encapsulation layer may comprise an encapsulation resin having a glass transition temperature of 0° C. or less, for example, −10° C. or less, −20° C. or less, −30° C. or less, or −40° C. or less. In another example, the adhesive layer in the encapsulation layer may comprise an encapsulation resin having a glass transition temperature of 85° C. or more, 90° C. or more, 95° C. or more, or 100° C. or more. In this specification, the glass transition temperature may mean, unless otherwise specified, a glass transition temperature after curing at a temperature of about 100° C. for about 120 minutes; a glass transition temperature after irradiating with ultraviolet at an irradiance level of about 1 J/cm$^2$ or more; or a glass transition temperature after ultraviolet irradiation, followed by further thermosetting.

In one example, the encapsulation resin may comprise a styrene resin or elastomer, a polyolefin resin or elastomer, other elastomers, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluorine resin or elastomer or a mixture thereof, and the like.

As the styrene resin or elastomer, for example, styrene-ethylene-butadiene-styrene block copolymer (SEBS), styrene-isoprene-styrene block copolymer (SIS), acrylonitrile-butadiene-styrene block copolymer (ABS), acrylonitrile-styrene-acrylate block copolymer (ASA), styrene-butadiene-styrene block copolymer (SBS), styrene homopolymer or a mixture thereof can be exemplified. As the olefin resin or elastomer, for example, a high density polyethylene resin or elastomer, a low density polyethylene resin or elastomer, a polypropylene resin or elastomer or a mixture thereof can be exemplified. As the elastomer, for example, an ester thermoplastic elastomer, an olefin elastomer, a silicone elastomer, an acrylic elastomer or a mixture thereof, and the like can be used. In particular, as the olefin thermoplastic elastomer, a polybutadiene resin or elastomer or a polyisobutylene resin or elastomer, and the like can be used. As the polyoxyalkylene resin or elastomer, for example, a polyoxymethylene resin or elastomer, a polyoxyethylene resin or elastomer or a mixture thereof, and the like can be exemplified. As the polyester resin or elastomer, for example, a polyethylene terephthalate resin or elastomer, a polybutylene terephthalate resin or elastomer or a mixture thereof, and the like can be exemplified. As the polyvinyl chloride resin or elastomer, for example, polyvinylidene chloride and the like can be exemplified. As the mixture of hydrocarbons, for example, hexatriacotane or paraffin, and the like can be exemplified. As the polyamide resin or elastomer, for example, nylon and the like can be exemplified. As the acrylate resin or elastomer, for example, polybutyl (meth) acrylate and the like can be exemplified. As the epoxy resin or elastomer, for example, bisphenol types such as bisphenol A type, bisphenol F type, bisphenol S type and a hydrogenated product thereof; novolak types such as phenol novolak type or cresol novolak type; nitrogen-containing cyclic types such as triglycidyl isocyanurate type or hydantoin type; alicyclic types; aliphatic types; aromatic types such as naphthalene type and biphenyl type; glycidyl types such as glycidyl ether type, glycidyl amine type and glycidyl ester type; dicyclo types such as dicyclopentadiene type; ester types; ether ester types or a mixture thereof, and the like can be exemplified. As the silicone resin or elastomer, for example, polydimethylsiloxane and the like can be exemplified. In addition, as the fluororesin or elastomer, a polytrifluoroethylene resin or elastomer, a polytetrafluoroethylene resin or elastomer, a polychlorotrifluoroethylene resin or elastomer, a polyhexafluoropropylene resin or elastomer, polyfluorinated vinylidene, polyfluorinated vinyl, polyfluorinated ethylene propylene or a mixture thereof, and the like can be exemplified.

The resins or elastomers listed above may be also used, for example, by being grafted with maleic anhydride or the like, by being copolymerized with other resins or elastomers through monomers for producing resins or elastomers, and by being modified with other compounds. An example of other compounds above may include carboxyl-terminal butadiene-acrylonitrile copolymers and the like.

In one example, the encapsulation layer may comprise, but is not limited to, the olefin elastomer, the silicone elastomer or the acrylic elastomer, and the like among the above-mentioned types as the encapsulation resin.

In one embodiment of the present application, the encapsulation resin may be an olefin resin. In one example, the encapsulation resin may comprise a polymer derived from butylene. The polymer derived from butylene may mean that at least one of the polymerized units of the polymer is consisted of butylene. Since the polymer derived from butylene has a very low polarity, is transparent, and has almost no influence of corrosion, excellent moisture barrier properties and endurance reliability can be realized when used as an encapsulation material or a sealing material.

In the present application, the polymers derived from butylene may be also a homopolymer of a butylene monomer; a copolymer obtained by copolymerizing a butylene monomer and another polymerizable monomer; a reactive oligomer using a butylene monomer; or a mixture thereof. In the present application, the derived polymer may mean that the monomers are forming polymers in polymerized units. The butylene monomer may include, for example, 1-butene, 2-butene or isobutylene.

Other monomers polymerizable with the butylene monomers or derivatives may include, for example, isoprene, styrene, or butadiene and the like. By using the copolymer, physical properties such as processability and degree of cross-linking can be maintained and thus heat resistance of the adhesive itself can be secured when applied to organic electronic devices.

In addition, the reactive oligomer using the butylene monomer may comprise a butylene polymer having a reactive functional group. The oligomer may have a weight average molecular weight ranging from 500 to 5,000. Furthermore, the butylene polymer may be coupled to another polymer having a reactive functional group. The other polymer may be, but is not limited to, alkyl (meth)acrylate. The reactive functional group may be a hydroxy group, a carboxyl group, an isocyanate group or a nitrogen-containing group. Also, the reactive oligomer and the other polymer may be cross-linked by a multifunctional cross-linking agent, and the multifunctional cross-linking agent may be at least one selected from the group consisting of an isocyanate cross-linking agent, an epoxy cross-linking agent, an aziridine cross-linking agent and a metal chelate cross-linking agent.

In the encapsulation layer, the resin or elastomer component may have a weight average molecular weight (Mw) to an extent such that the pressure-sensitive adhesive composition can be formed into a film shape. For example, the resin or elastomer may have a weight average molecular weight of about 100,000 to 2,000,000, 120,000 to 1,500,000, or 150,000 to 1,000,000 or so. The term weight average molecular weight herein means a value converted to standard polystyrene measured by GPC (Gel Permeation Chromatograph). However, the resin or elastomer does not necessarily have the above-mentioned weight average molecular weight. For example, in the case where the molecular weight of the resin or elastomer component is not in a level enough to form a film, a separate binder resin may be blended into the pressure-sensitive adhesive composition.

In another embodiment, the encapsulation resin included in the adhesive layer according to the present application may be a curable resin. As the specific kind of the curable resin, various thermosetting resins, photo-curable resins, or dual curable resins, as known in the art can be used. The term "thermosetting resin" herein means a resin that can be cured through an appropriate heat application or aging process, the term "photo-curable resin" herein means a resin that can be cured by irradiation of electromagnetic waves, and the term "dual curable resin" herein means a resin that has both the properties of a thermosetting resin and a photo-curable resin and can be cured by irradiation of electromagnetic waves and application of heat. In addition, in the above, microwaves, infrared (IR), ultraviolet (UV), X-ray and gamma ray as well as alpha-particle beam, proton beam, a particle beam such as a neutron beam and an electron beam, and the like can be included in the category of electromagnetic waves. The photo-curable resin may include, for example, a cationic photo-curable resin. The cationic photo-curable resin means a resin which can be cured by cationic polymerization or cationic curing reaction induced by irradiation of an electromagnetic wave.

The specific kind of the curable resin is not particularly limited as long as it has the above-mentioned characteristics. For example, those which may be cured to exhibit an adhesive property may include a resin comprising one or more thermally curable functional groups such as a glycidyl group, an isocyanate group, a hydroxy group, a carboxyl group or an amide group, or one or more functional groups capable of being cured by irradiation of an electromagnetic wave such as an epoxide group, a cyclic ether group, a sulfide group, an acetal group or a lactone group. The specific kind of the resin may include an acrylic resin, a polyester resin, an isocyanate resin or an epoxy resin, and the like, but is not limited thereto.

As the curable resin, aromatic or aliphatic; or linear or branched epoxy resins may be used. In one example, an epoxy resin having an epoxy equivalent of 180 g/eq to 1,000 g/eq, which contains two or more functional groups, may be used. By using the epoxy resin having an epoxy equivalent in the above range, characteristics such as adhesion performance and glass transition temperature of the cured product can be effectively maintained. An example of such an epoxy resin may include one or more selected from the group consisting of a cresol novolac epoxy resin, a bisphenol A type epoxy resin, a bisphenol A type novolak epoxy resin, a phenol novolak epoxy resin, a tetrafunctional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

In one example, as the curable resin, an epoxy resin comprising a cyclic structure in a molecular structure can be used, and an epoxy resin comprising an aromatic group such as, for example, a phenyl group can be also used. When the epoxy resin comprises an aromatic group, the cured product has excellent thermal and chemical stability and simultaneously exhibits a low moisture absorption amount, whereby the reliability of the organic electronic device encapsulation structure can be improved. A specific example of the aromatic group-containing epoxy resin may be one or more selected from the group consisting of a biphenyl type epoxy resin, a dicyclopentadiene type epoxy resin, a naphthalene type epoxy resin, a dicyclopentadiene-modified phenol type epoxy resin, a cresol-based epoxy resin, a bisphenol-based epoxy resin, a xylol-based epoxy resin, a multifunctional epoxy resin, a phenol novolak epoxy resin, a triphenol methane type epoxy resin, and an alkyl-modified triphenol methane epoxy resin and the like, but is not limited thereto.

In an embodiment of the present application, the encapsulation layer may comprise, depending on the type of the encapsulation resin, a multifunctional active energy ray polymerizable compound that can be polymerized by irradiation of an active energy ray together with the encapsulation resin. The active energy ray polymerizable compound may mean a compound having two or more functional groups capable of participating in polymerization reaction by irradiation of an active energy ray, for example, functional groups containing an ethylenically unsaturated double bond such as an acryloyl group or a methacryloyl group, or functional groups such as an epoxy group or an oxetane group.

As the multifunctional active energy ray polymerizable compound, for example, a multifunctional acrylate (MFA) can be used.

The active energy ray polymerizable compound may be included in an amount of 5 to 30 parts by weight, 5 to 25 parts by weight, 8 to 20 parts by weight, 10 to 18 parts by weight or 12 to 18 parts by weight, relative to 100 parts by weight of the encapsulation resin.

The multifunctional active energy ray polymerizable compound which can be polymerized by irradiation of the active energy ray can be used without any limitation, as long as it satisfies Formula 1 above. For example, the compound may include 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-diol di(meth)acrylate, tricyclodecanedimethanol (meth)diacrylate, dimethyloldicyclopentane di(meth)acrylate, neopentylglycol-modified trimethylol propane di(meth)acrylate, admantane di(meth)acrylate, trimethylolpropane tri(meth)acrylate, or a mixture thereof.

As the multifunctional active energy ray polymerizable compound, for example, a compound having a molecular weight of less than 1,000 and containing two or more functional groups can be used. In this case, the molecular weight may mean a weight average molecular weight or a typical molecular weight. The ring structure included in the multifunctional active energy ray polymerizable compound may be any one of a carbocyclic structure or a heterocyclic structure; or a monocyclic or polycyclic structure.

In an embodiment of the present application, the encapsulation layer may further comprise a radical initiator. The radical initiator may be a photoinitiator or a thermal initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The radical initiator may be included in a ratio of 0.2 to 20 parts by weight, 0.5 to 18 parts by weight, 1 to 15 parts by weight, or 2 to 13 parts by weight, relative to 100 parts by weight of the active energy ray polymerizable compound. As a result, the reaction of the active energy ray polymerizable compound can be effectively induced and deterioration of the physical properties of the pressure-sensitive adhesive composition due to the residual components after curing can be also prevented.

In an embodiment of the present application, the encapsulation layer of the encapsulation film may further comprise a curing agent depending on the kind of the encapsulation resin. For example, it may further comprise a curing agent capable of reacting with the above-mentioned encapsulation resin to form a cross-linked structure or the like.

The kind of the curing agent may be appropriately selected and used depending on the type of the encapsulation resin or the functional group contained in the resin.

In one example, when the encapsulation resin is an epoxy resin, the curing agent is a curing agent of the epoxy resin known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or more can be used. As such a compound, for example, 2-methylimidazole, 2-heptadecylimidazole, 2-phenylimidazole, 2-phenyl-4-methylimidazole or 1-cyanoethyl-2-phenylimidazole, and the like may be exemplified, but is not limited thereto.

The content of the curing agent may be selected depending on composition of the composition, for example, the type or ratio of the encapsulation resin. For example, the curing agent may be contained in an amount of 1 to 20 parts by weight, 1 to 10 parts by weight or 1 to 5 parts by weight, relative to 100 parts by weight of the encapsulation resin. However, the weight ratio can be changed depending on the type and ratio of the encapsulation resin or the functional group of the resin, or the cross-linking density to be implemented, and the like.

When the encapsulation resin is a resin which can be cured by irradiation of the active energy ray, for example, a cationic photopolymerization initiator may be used as the initiator.

As the cationic photopolymerization initiator, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

In one example, as the cationic initiator, an ionized cationic photopolymerization initiator may be used.

In one example, the encapsulation layer may further comprise a tackifier, where the tackifier may be, preferably, a hydrogenated cyclic olefin polymer. As the tackifier, for example, a hydrogenated petroleum resin obtained by hydrogenating a petroleum resin can be used. The hydrogenated petroleum resin may be partially or fully hydrogenated and may be also a mixture of such resins. Such a tackifier can be selected to have good compatibility with the pressure-sensitive adhesive composition, excellent moisture barrier property, and low organic volatile components. A specific example of the hydrogenated petroleum resin may include a hydrogenated terpene resin, a hydrogenated ester resin or a hydrogenated dicyclopentadiene resin, and the like. The tackifier may have a weight average molecular weight of about 200 to 5,000. The content of the tackifier can be appropriately adjusted as necessary. For example, the content of the tackifier may be selected in consideration of the gel content to be described below, and the like. According to one example, it can be contained in a ratio of 5 to 100 parts by weight, 8 to 95 parts by weight, 10 to 93 parts by weight or 15 to 90 parts by weight, relative to 100 parts by weight of the solid content.

In one example, the pressure-sensitive adhesive layer may have a tensile modulus at 25° C. of 0.001 MPa to 500 MPa. The tensile elastic modulus at 25° C. of the pressure-sensitive adhesive layer may be 0.01 MPa or more, 0.1 MPa or more, or 1 MPa or more, and 100 MPa or less, 50 MPa or less, or 5 MPa or less. In addition, the adhesive layer may have a tensile modulus at 25° C. of 500 MPa to 1000 MPa. The tensile modulus at 25° C. of the adhesive layer may be 600 MPa or more, 700 MPa or more, or 730 MPa or more, and 900 MPa or less, 800 MPa or less, or 770 MPa or less. In the relation of the elastic modulus within the above range, the encapsulation film can be also effectively applied to, for example, a device having a large area without interlayer peeling.

The encapsulation layer of the present application may further comprise a moisture adsorbent. In this specification, the term "moisture adsorbent (moisture absorbent)" may mean a component capable of adsorbing or removing moisture or oxygen introduced from the outside through chemical reaction with the moisture.

In one example, with regard to the moisture adsorbent, the pressure-sensitive adhesive layer may comprise a large amount of moisture adsorbent as compared with the adhesive layer. In addition, the adhesive layer may comprise little or no moisture adsorbent as compared with the pressure-sensitive adhesive layer. In the above structure, for example, when the encapsulation structure is implemented so that the adhesive layer is in contact with the organic electronic element, excellent moisture barrier properties can be realized without causing damage of the device. In one example, the pressure-sensitive adhesive layer may comprise the encapsulation resin, and may comprise 20 to 50 parts by weight of the moisture adsorbent, relative to 100 parts by weight of the encapsulation resin. Within the above range, the content of the moisture adsorbent in the pressure-sensitive adhesive layer may be 25 or more, 30 or more, 35 or more, or 40 or more, and 45 or less, 40 or less, 35 or less, or 30 or less, relative to 100 parts by weight of the encapsulation resin. In another example, the adhesive layer may comprise no moisture adsorbent, and even if it comprises a moisture adsorbent, it may comprise a slight amount of moisture adsorbent. For example, the adhesive layer may comprise less than 20 parts by weight or less than 10 parts by weight of the moisture adsorbent, relative to 100 parts by weight of the encapsulation resin. Since the adhesive layer may comprise no moisture adsorbent, the lower limit of the content of the moisture adsorbent in the adhesive layer may be 0 parts by weight.

The kind of the moisture adsorbent may be, for example, one or more selected from the group consisting of a metal oxide, a metal salt and an organic metal oxide. Specifically, the metal oxide may be, for example, lithium oxide ($Li_2O$), sodium oxide ($Na_2O$), barium oxide (BaO), calcium oxide (CaO) or magnesium oxide (MgO), and the like, and the metal salt may include, for example, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto. As the moisture adsorbent which can be contained in the encapsulation layer, one or two or more of the above-mentioned constitutions may be also used. In one example, when two or more are used as the moisture adsorbent, calcined dolomite and the like may be used.

In one example, the encapsulation film of the present application may further comprise a protective layer present on the other side of the metal layer. The material constituting the protective layer is not particularly limited and may be selected from, for example, polyethylene terephthalate, polytetrafluoroethylene, polyethylene, polypropylene, polybutene, polybutadiene, vinyl chloride copolymer, polyurethane, ethylene-vinyl acetate, ethylene-propylene copolymer, ethylene-ethyl acrylate copolymer, ethylene-methyl acrylate copolymer, polyimide, nylon, a styrene resin or elastomer, a polyolefin resin or elastomer, other elastomers, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a liquid crystal polymer, and a combination thereof, but is not limited thereto.

In one example, the encapsulation film of the present application may further comprise an adhesive layer present between the metal layer and the protective layer. The adhesive layer serves to adhere the protective layer to the metal layer, and the material thereof is not particularly limited and may be the same as or different from the material of the encapsulation layer described above.

The present application also relates to a method for manufacturing the encapsulation film described above. An exemplary method for manufacturing the encapsulation film may comprise a step of cutting the side of the encapsulation layer. In addition, the manufacturing method may comprise a step of cutting the side surface of the metal layer. The order of the step of cutting the side of the encapsulation layer and the step of cutting the side of the metal layer is not particularly limited, and for example, it is possible to cut the side of the encapsulation layer and then to cut the side of the metal layer. The cutting step may mean forming the encapsulation layer or the metal layer in a desired shape, for example, polygonal or circular.

Here, the method for manufacturing the film may comprise forming the encapsulation layer into a film or sheet form. In one example, the method may comprise applying a coating liquid containing components constituting the above-described encapsulation layer on a substrate or a release film in a sheet or film shape, and drying the applied coating liquid.

Also, the method for manufacturing the encapsulation film may comprise a step of forming a metal layer, where the metal layer may be formed, for example, of a metal foil or by depositing a metal on the substrate. For example, the metal layer can be produced by an electrolysis or rolling method.

In the present application, the step of cutting the side of the encapsulation layer may comprise cutting with a $CO_2$ laser or an optical fiber laser. Also, in one example, the step of cutting the side of the metal layer may comprise cutting with a $CO_2$ laser, an optical fiber laser or a knife cutter. In one example, the steps of cutting may be performed in a manner that a gap or cured portion of the encapsulation layer is secured by a laser and then the metal layer is cut using a knife cutter. For example, it can be carried out by adopting a suitable form such as a wooden form, a pinnacle, a slitting, and a super cutter. In an embodiment of the present application, the cutting surface may be the side of the encapsulation layer or the metal layer after cutting. Also, in one example, the cutting surface or side of the encapsulation layer in contact with the laser can be cured by a laser. Thus, the encapsulation layer cutting and the formation of the side cured portion of the encapsulation layer can be performed in one process, for example, a laser machining process.

Specifically, the step of cutting the side of the encapsulation layer may comprise cutting with a laser beam having a size of 1 µm to 1000 µm, 15 µm to 900 µm, 38 µm to 880 µm, 47 µm to 770 µm, or 55 µm to 660 µm. In the present application, depending on the width of the side cured portion, the beam size of the laser can be appropriately controlled.

Furthermore, the side cutting of the encapsulation layer can be controlled, for example, according to the output and/or repeating rate of the laser. In one example, the output of the laser can be controlled by 100 W to 250 W, 150 W to 230 W or 160 W to 225 W. Also, the step of cutting the side of the encapsulation layer may comprise cutting with a laser beam having a cutting speed of 200 mm/s to 1000 mm/s, 280 mm/s to 900 mm/s, or 370 mm/s to 820 mm/s. By adjusting the output or the cutting speed of the laser to the above range, the present application can prepare the gap, the cured portion or the inclined portion, as described above, in the desired forms, while simultaneously performing formation and cutting of the side of the encapsulation layer.

In an embodiment of the present application, the step of cutting the side of the metal layer may comprise cutting with a laser beam having a size of 1 µm to 30 µm, 2 µm to 28 µm, 7 µm to 23 µm, or 11 µm to 19 µm. The laser cutting may also comprise cutting with a laser beam having an output of 70 W to 150 W, 78 W to 130 W, or 83 W to 110 W. The laser cutting may also comprise cutting with a laser beam having a cutting speed of 500 mm/s to 1000 mm/s, 560 mm/s to 910 mm/s, 610 mm/s to 830 mm/s, or 660 mm/s 780 mm/s. By adjusting the size of the laser beam, the output or the cutting speed of the laser to the above range, the present application can prepare the above-described gap in the desired form, while simultaneously performing formation and cutting of the side of the metal layer.

The present application also relates to an organic electronic device. FIG. 2 is a diagram showing an exemplary organic electronic device. As shown in FIG. 2, the organic electronic device may comprise a substrate (2); an organic electronic element (21) formed on the substrate (2); and an encapsulation film (1) which encapsulates the entire surface, for example, all the top and the side surfaces of the organic electronic element (21). The encapsulation film (1) may comprise an encapsulation layer (12) comprising a pressure-sensitive adhesive layer (121) and an adhesive layer (122), containing a pressure-sensitive adhesive composition or an adhesive composition in a cross-linked state. Specifically, the organic electronic device (2) may be formed so that the adhesive layer (122) of the encapsulation layer (12) encapsulates the entire surface of the organic electronic element (22).

Here, the organic electronic element may be, for example, an organic light emitting element.

The present application also relates to a method for manufacturing an organic electronic device. The organic electronic device can be produced using, for example, the encapsulation film.

The encapsulation layer can be formed as a structural encapsulation layer that efficiently fixes and supports the substrate and the metal layer while exhibiting excellent moisture barrier properties and optical characteristics in an organic electronic device.

In addition, the encapsulation layer may be formed as a stable encapsulation layer regardless of the form of the organic electronic device such as top emission or bottom emission.

In this specification, the term encapsulation layer may mean a pressure-sensitive adhesive covering all the top and side surfaces of the organic electronic element.

The present application also relates to a method for manufacturing an organic electronic device. For example, the manufacturing method may comprise steps of applying the above-described encapsulation film to a substrate, on which an organic electronic element is formed, to cover the organic electronic element; and curing the encapsulation film. The curing step of the encapsulation film means the curing of the encapsulation layer.

In this specification, the term "curing" may mean that the pressure-sensitive adhesive composition of the present invention forms a cross-linked structure through heating or UV irradiation process, and the like and is produced in the form of a pressure-sensitive adhesive. Alternatively, it may mean that the adhesive composition is produced in the form of an adhesive.

Specifically, the organic electronic element may be formed by forming a transparent electrode on a glass or polymer film used as a substrate by a method such as vacuum evaporation or sputtering, forming a luminescent organic material layer composed of, for example, a hole transporting layer, a light emitting layer and an electron transporting layer, and the like on the transparent electrode, and then further forming an electrode layer thereon. Subsequently, the encapsulation layer of the encapsulation film is placed to cover the whole surface of the organic electronic element of the substrate subjected to the above process.

Effects of the Invention

The present application provides an encapsulation film which allows forming a structure capable of effectively blocking moisture or oxygen introduced into the organic electronic device from the outside, and has excellent handleability and processability, and excellent bonding property between the encapsulation layer and the panel of the organic electronic device and endurance reliability.

BRIEF DESCRIPTION OF THE DRAWINGS

FIG. 1 is a cross-sectional view showing an exemplary encapsulation film.

FIG. 2 is a cross-sectional view showing an exemplary organic electronic device.

DETAILED DESCRIPTION OF THE INVENTION

Hereinafter, the above description will be described in more detail with reference to Examples and Comparative Examples. However, the scope of the present application is not limited by the following examples.

Example 1

Preparation of Pressure-Sensitive Adhesive Layer Solution

A CaO (average particle diameter of less than 5 μm) solution (solid content 50%) was prepared as a moisture adsorbent, and the solution was dispersed to uniformly distribute CaO. Separately, a solution (solid content 70%), in which 200 g of a butyl rubber resin (BTR-2068, Sunwoo Chemtech) and 60 g of a DCPD petroleum resin (SU5270, Sunwoo Chemtech) were diluted with toluene, was prepared and then the solution was homogenized. 100 g of the prepared CaO solution was added to the homogenized solution, 10 g of a photo-curing agent (TCDDA, Miwon) and 15 g of a photoinitiator (Irgacure 819, Ciba) were added thereto and then the mixture was stirred at high speed for 1 hour to prepare a solution of a pressure-sensitive adhesive layer.

Preparation of Adhesive Layer Solution 150 g of an epoxy resin (KSR 277, Kukdo Chemical) and 50 g of a phenoxy resin (YP-55, Tohto Kasei) were diluted with methyl ethyl ketone to prepare a solution (solid content 70%), and then the solution was homogenized. 3 g of imidazole (Shikoku Chemicals) as a curing agent was added thereto, and then the mixture was stirred at high speed for 1 hour to prepare a solution of an adhesive layer.

Production of Encapsulation Layer

The solution of the pressure-sensitive adhesive layer prepared above was applied to the release surface of a releasing PET using a comma coater and dried in a dryer at 130° C. for 3 minutes to form a pressure-sensitive adhesive layer.

The solution of the adhesive layer prepared above was applied to the release surface of the releasing PET using the comma coater and dried in the dryer at 130° C. for 3 minutes to form an adhesive layer having a thickness of 20 μm.

The pressure-sensitive adhesive layer and the adhesive layer were laminated to produce a multilayer encapsulating layer.

Production of Encapsulation Film

The release-treated PET attached to both outsides of the encapsulation layer prepared above was peeled off and the encapsulation layer was laminated so that the pressure-sensitive adhesive layer was in contact with one surface of a metal layer (Invar, Hitachi) prepared in advance.

The encapsulation layer was cut using a $CO_2$ laser (E-400i, Coherent) at a frequency of 10 KHz, an output of 180 to 220 W and a cutting speed of 700 mm/s and then, the metal layer was cut using a Fiber laser (YLR-300-AC-Y11, IPG) at an output of 90 W and a cutting speed of 700 mm/s to produce an encapsulation film.

The gap (a) between any one side of the metal layer sides and the encapsulation layer side corresponding to the side was 100 μm.

Example 2

An encapsulation film was produced in the same manner as in Example 1, except that the thickness of the adhesive layer was changed to 25 μm.

Example 3

An encapsulation film was produced in the same manner as in Example 1, except that the thickness of the adhesive layer was changed to 30 μm.

Comparative Example 1

An encapsulation film was produced in the same manner as in Example 1, except that the thickness of the adhesive layer was changed to 4 μm.

Comparative Example 2

An encapsulation film was produced in the same manner as in Example 1, except that the thickness of the adhesive layer was changed to 42 μm.

Comparative Example 3

An encapsulation film was produced in the same manner as in Example 1, except that the gap (a) was 10 μm.

Experimental Example 1

Confirmation of Unbound Portion Occurrence of Encapsulation Film

After attaching the encapsulation films prepared in Examples 1 to 3 and Comparative Example 1 on a substrate on which an organic electronic element was formed, the films were observed on the lower surface of the encapsulation layers using an electron microscope (DinoCapture 2.0, Dino-lite), in order to confirm whether or not unbound portions occurred.

It can be confirmed that the encapsulation films produced in Examples 1 to 3 generate no unbound portion upon boding the metal layer and the encapsulation layer together.

In addition, it can be confirmed that upon bonding the encapsulation film produced in Comparative Example 1 together, unbound portions have been generated.

Experimental Example 2

Confirmation of Alignment Error Occurrence of Encapsulation Film

After attaching the encapsulation films prepared in Examples 1 to 3 and Comparative Examples 2 and 3 on a substrate on which an organic electronic element was formed, the sides of the encapsulation films were observed using an electron microscope (DinoCapture 2.0, Dino-lite), in order to confirm whether or not alignment errors occurred.

It can be confirmed that the encapsulation films prepared in Examples 1 to 3 generate no alignment error, since the side ends of the encapsulation layer and the side ends of the metal layer comply with each other within an error range of ±5 μm upon bonding them together on the substrate on which an element was formed.

On the other hand, it can be confirmed that in the encapsulation films prepared in Comparative Examples 2 and 3, contamination of the organic electronic device panel and alignment errors have been caused due to the encapsulation layer overflows from the edge end of the metal layer to the outside upon bonding them together on the substrate on which an element was formed.

DESCRIPTION OF REFERENCE NUMERALS

11: metal layer
12: encapsulation layer
111: first surface
112: second surface
121: pressure-sensitive adhesive layer
122: adhesive layer
a: gap
b: thickness of adhesive layer
c: cured portion
2: substrate
21: organic electronic element

The invention claimed is:

1. An encapsulation film for an organic electronic element comprising:
    a metal layer having a first surface and a second surface opposite to said first surface; and
    an encapsulation layer provided on said first surface of the metal layer and located inside edges of said first surface so that an edge of the encapsulation layer forms a gap of 50 μm to 500 μm with an edge of said first surface,
    wherein said encapsulating layer comprises a pressure-sensitive adhesive layer, and an adhesive layer having a thickness of 5 μm to 40 μm, and
    wherein the pressure-sensitive adhesive layer is attached to the metal layer and the adhesive layer encapsulates entire surface of the organic electronic element such that the adhesive layer, the pressure-sensitive adhesive layer, and the metal layer are sequentially disposed on the organic electronic element.

2. The encapsulation film according to claim 1, wherein the encapsulation layer has a cured portion at the edge of the encapsulation layer.

3. The encapsulation film according to claim 2, wherein the cured portion has a width in a range of 10 μm to 100 μm.

4. The encapsulation film according to claim 2, wherein the cured portion has a degree of curing of 10% to 100%.

5. The encapsulation film according to claim 1, wherein a side of the encapsulation layer is a laser beam cutting surface having a size of 1 μm to 1000 μm.

6. The encapsulation film according to claim 1, wherein the metal layer comprises any one of a metal, a metal oxide, a metal nitride, a metal carbide, a metal oxynitride, a metal oxyboride, and a combination thereof.

7. The encapsulation film according to claim 1, wherein the pressure-sensitive adhesive layer comprises an encapsulation resin having a glass transition temperature of 0° C. or less.

8. The encapsulation film according to claim 1, wherein the adhesive layer comprises the encapsulation resin having a glass transition temperature of 85° C. or more after curing.

9. The encapsulation film according to claim 1, wherein the encapsulation layer further comprises a moisture adsorbent.

10. A method for manufacturing the encapsulation film according to claim 1, comprising a step of cutting a side of the encapsulating layer.

11. The method for manufacturing the encapsulation film according to claim 10, further comprising a step of cutting a side of the metal layer.

12. The method for manufacturing the encapsulation film according to claim 10, wherein the step of cutting a side of the encapsulation layer comprises cutting with a $CO_2$ laser or an optical fiber laser.

13. The method for manufacturing the encapsulation film according to claim 11, wherein the step of cutting a side of the metal layer comprises cutting using a $CO_2$ laser, an optical fiber laser or a knife cutter.

14. The method for manufacturing the encapsulation film according to claim 10, wherein the step of cutting a side of the encapsulation layer comprises cutting with a laser beam having a size of 1 μm to 1000 μm.

15. The method for manufacturing the encapsulation film according to claim 11, wherein the step of cutting a side of the metal layer comprises cutting with a laser beam having a size of 1 μm to 30 μm.

16. An organic electronic device comprising a substrate, an organic electronic element formed on said substrate and the encapsulation film according to claim 1 for entirely encapsulating said organic electronic element.

17. The organic electronic device according to claim 16, wherein the adhesive layer of the encapsulation film encapsulates entire surface of the organic electronic element.

18. A method for manufacturing an organic electronic device comprising steps of applying the encapsulation film according to claim 1 to a substrate, on which an organic electronic element is formed, to cover said organic electronic element; and curing said encapsulation film.

* * * * *